United States Patent [19]

Brunner et al.

[11] Patent Number: 4,985,681

[45] Date of Patent: Jan. 15, 1991

[54] PARTICLE BEAM MEASURING METHOD FOR NON-CONTACT TESTING OF INTERCONNECT NETWORKS

[75] Inventors: Matthias Brunner, Kirchheim; Juergen Frosien, Ottobrunn; Reinhold Schmitt; Burkhard Lischke, both of Munich, all of Fed. Rep. of Germany

[73] Assignee: Siemens Aktiengesellschaft, Berlin and Munich

[21] Appl. No.: 813,875

[22] Filed: Dec. 27, 1985

[30] Foreign Application Priority Data

Jan. 18, 1985 [DE] Fed. Rep. of Germany ....... 3501562

[51] Int. Cl.$^5$ ............................................. G01R 31/00
[52] U.S. Cl. .................................. 324/501; 324/537; 324/158 R
[58] Field of Search ................................ 324/51–54, 324/73 PC, 158 R, 71.3, 500, 501; 250/310, 311

[56] References Cited

U.S. PATENT DOCUMENTS

| | | | |
|---|---|---|---|
| 3,531,716 | 9/1970 | Tarui et al. | 324/158 R |
| 3,549,999 | 12/1970 | Norton | 324/51 X |
| 3,796,947 | 3/1974 | Harrod et al. | 324/51 |
| 4,169,244 | 9/1979 | Plows | 324/51 X |
| 4,417,203 | 11/1983 | Pfeiffer et al. | 324/71.3 X |
| 4,443,278 | 4/1984 | Zingher | 73/159 X |
| 4,573,008 | 2/1986 | Lischke | 324/51 X |
| 4,577,147 | 3/1986 | Frosien et al. | 324/71.3 |
| 4,578,279 | 3/1986 | Zingher | 324/51 X |
| 4,621,232 | 11/1986 | Chang et al. | 324/51 X |

FOREIGN PATENT DOCUMENTS 0066070 12/1982 European Pat. Off. .
0066086 12/1982 European Pat. Off. .

OTHER PUBLICATIONS

Journal of Physics; vol. 3, Oct. 1970, "Electron Beam Testing of Wired or Printed Circuit Modules" by J. M. Engel et al, pp. 1505–1508.

"Noncontact Testing of Interconnections in Film Integrated Circuits Using an Electron Beam" by J. M. Sebeson et al, Bell Telephone Laboratories, 1973, pp. 138–145.

"Electron-Beam Testing of VLSI Circuits" by Wolfgang et al, 8093 IEEE Trans. on Electron Devices, vol. ED-26, No. 4 Apr., 1979, pp. 549–559.

"Tri-Potential Method for Testing Electrical Opens and Shorts in Multi-Layer Ceramic Packaging Modules", by T. P. Chang et al, IBM Technical Disclosure Bulletin, vol. 24, No. 11A, Apr., 1982, pp. 5388–5390.

*Primary Examiner*—Kenneth Wieder
*Assistant Examiner*—W. Edmonds
*Attorney, Agent, or Firm*—Hill, Van Santen, Steadman & Simpson

[57] ABSTRACT

For testing an interconnect network for shorts and interruptions, a point of the network to be tested is charged with a particle beam. Subsequently, a potential at least one further contact point is read with the same particle beam and an unaltered primary energy. An identification of potential occurs by documenting the secondary electrons triggered at the contact points. In order to avoid a disturbing change of potential during the measuring phase, the measuring time is only a fraction of the time for charging the network.

16 Claims, 2 Drawing Sheets

PARTICLE BEAM MEASURING METHOD FOR NON-CONTACT TESTING OF INTERCONNECT NETWORKS

BACKGROUND OF THE INVENTION

The invention relates to a particle beam testing method for non-contact testing of interconnect networks for shorts and opens.

As a consequence of the increasing degree of integration and of the progressive miniaturization of semiconductor components, it has become necessary to correspondingly reduce the dimension of the interconnect networks producing the electrical connection between various VLSI circuits. The demand of being able to wire a large plurality of contact points on as small a space as possible therefore led to the development of ceramic multi-layer modules, among other things, in the field of wiring technology. In the meantime, the density of contact points on these modules has become so high that testing their electrical properties with mechanical contact tips can now be carried out only given great difficulty. Electron beam measuring instruments for non-contact testing of interconnect networks for shorts and opens are therefore being increasingly employed. Such an electron beam measuring method is described in IBM Techn. Discl. Bull. Vol. 24, Number 11a, pages 5388-5290, incorporated herein by reference. An installation for the implementation of such a method is disclosed, for example, by European Patent No. 0 066 086 (particularly see FIG. 12 and the appertaining part of the specification), incorporated herein by reference.

The basis for these known methods is the possibility of applying potentials to an insulated specimen with electron beams or documenting existing distributions of potential by detecting the secondary electrons triggered by the primary electron beam. For testing an interconnect network, at least one of the contact points is charged with a first electron beam, and subsequently, the distribution of charge or potential arising in accordance with the network geometry is read with a second electron beam. Electron beams differing in energy are employed for applying and reading the potentials.

The documentation of shorts and opens in a network can occur by comparing the secondary electron signals measured at various contact points. When, for example, the same potential as at the charging point is observed at one of the contact points, i.e. when the same secondary electron current is registered in a secondary electron detector system within the measuring precision given an ideal detector characteristic, then these points are necessarily connected to one another in conductive fashion. When, by contrast, the secondary electron currents differ significantly from one another, then an opens must exist.

In order to prevent a change of the potentials during the reading or sensing with the read beam, the known methods operate with primary energies in the region of the neutral point. Since the primary electron current incident onto the specimen and the secondary electron current emanating from the specimen just compensate under these conditions, the primary electron energy must be modified when changing between a charging and a reading phase. This is technologically achieved in that a plurality of electron beams differing in energy are employed, or in that the high-voltage supply of an electron beam is switched. Both solutions, however, have decided disadvantages. Thus, when switching the high-voltage supply of an electron beam measuring instrument, electron-optical techniques are required in order to retain the position and focusing of the beam on the specimen. In addition, the known electronic difficulties when switching high voltages occur. The employment of a plurality of electron beams also requires a substantial added expenditure for electron-optic components since additional electron sources with corresponding, beam-shaping magnetic coils must be provided.

SUMMARY OF THE INVENTION

It is therefore an object of the invention to specify a particle beam measuring method, particularly an electron beam measuring method of the type initially specified, wherein a potential can be generated and can be read at an interconnect network under test with only one electron beam without changing the primary electron energy. This is achieved in accordance with the invention by first charging at least one point of an interconnecting network during a first time span by use of a particle beam of given energy directed to the at least one point. Subsequently, the same particle beam is directed with the same energy to at least one further point of the interconnect network. A potential at this further point is interrogated during a second time span by a measurement of secondary electrons emitted from the point. The second time span is significantly shorter in comparison to the first time span and the energy of the first particle beam has the same value during both the first and second time spans.

A particular advantage obtainable with the invention is that the technological design and construction of an electron beam measuring instrument for testing interconnect networks for shorts and opens is significantly simplified.

DESCRIPTION OF THE PREFERRED EMBODIMENTS

The basis of the method of the invention is the possibility of using an electron beam to apply and read potentials at an insulated specimen. For the purpose of charging the specimen, the electron energy must be selected such that the primary electron current incident on the specimen and the secondary electron current emanating from the specimen do not compensate. This is always the case when the primary electron energy does not coincide with the neutral point energy. The neutral point energy is material-dependent and typically lies in the region between one and several keV. Charges or potentials of every operational sign can thus be applied to a specimen with an electron beam by means of adequately long irradiation.

Since the energy distribution of the emitted secondary electrons changes due to existing specimen potentials, qualitative measurements of potential can be carried out by documenting the secondary electrons in suitable detectors, or quantitative potential measurements can also be carried out given use of secondary electron spectrometers. The measured variable is thus the secondary electron current respectively observed in the detector. The measured secondary electron signals may potentially have to be corrected by comparison to calibration signals since the energy distribution of the emitted secondary electrons is also influenced by local electrical fields at the point of incidence of the beam, in addition to being influenced by the specimen potential. The secondary electron signals measured at uncharged points are suitable, for example, for calibration, whereby the points are preferably uniformly distributed over the specimen.

Figure 1:
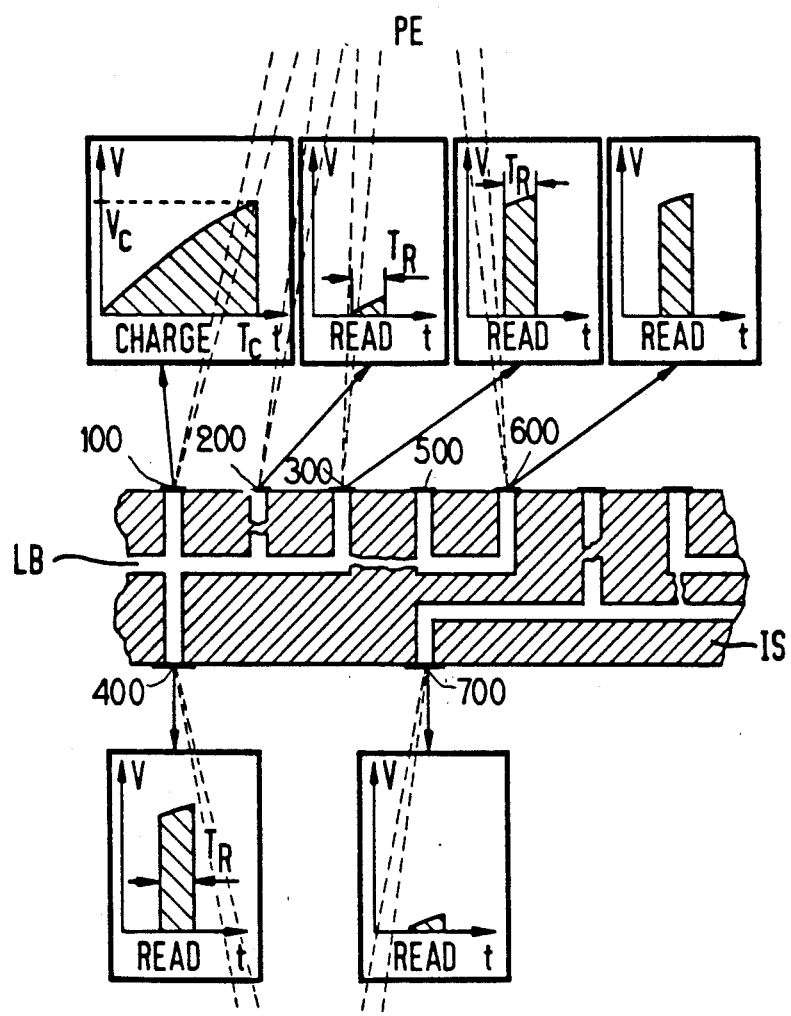
FIG. 1 illustrates a portion of a plurality of networks of a printed circuit board.

For testing a printed circuit board or a wiring module for shorts or opens with the method of the invention, a point of the network under test is first charged to the voltage $V_C$ by means of adequately long irradiation with an electron beam in a time $T_C$, and subsequently all other network points are successively read with the same electron beam and unmodified primary energy in the time $T_R$. When the same secondary electron current, i.e. the same voltage $V_C$, is observed at one of these points in the secondary electron detector at the required measuring precision after correction, then the two points are necessarily connected to one another in conductive fashion. When, by contrast, the measured potentials differ significantly from one another, then an open must exist. In order to prevent falsifications of the measured result due to the charging of the network points during the measuring phase, the measuring time $T_R$ is reduced with respect to the time $T_C$ required for charging the network, and is reduced in accordance with the condition specified below. FIG. 1 shall be referred to below for further explanation of the method of the invention.

The schematic drawing shows a portion of a plurality of networks of a printed circuit board. The interconnects LB connecting the various contact points 100 through 700 are embedded in an insulating layer IS which has been shown in shaded fashion. On the basis of the technical expense, the contact points 100 through 400 should be conductively connected to one another and form the network A. The contact points 500 and 600 should likewise be combined into a network B which lies insulated with respect to network A. The analogous case applies to the other contact points which are not referenced in detail in the drawing. Without limiting the universal applicability, it can be assumed that the networks are not charged at the beginning of the testing procedure. For the purpose of testing the electric properties of the networks A and B with the method of the invention, the electron beam PE shown with broken lines in the drawing is directed to one of the contact points of the network A, i.e. for example, to point 100. Since the primary electron energy does not coincide with the neutral point energy, the contact point 100 is charged up to a voltage $V_C$ in a time $T_C$ which is dependent on the capacitance of the network. The time-dependency of the applied voltage $V_C$ is shown in the upper left-hand part of FIG. 1 in the form of a diagram. The charging of the network to the voltage $V_C$ can be advantageously monitored via the secondary electron signal of an electron detector or of a secondary electron spectrometer. When the desired charging voltage $V_C$ is reached, the electron beam is blanked out and, given an unmodified primary energy, is subsequently directed to a different contact point of the network A in order to register the secondary electron current impinging upon a detector during the measuring time $T_R$. When the same secondary electron current (within the measuring precision), i.e. the same voltage $V_C$ as at the charging point 100, is observed, then this charging point and the measuring point are conductively connected to one another. This situation is realized for the contact point 300. Due to an in the network A, by contrast, the contact point 200 is not charged. When reading this point with the electron beam PE, a different secondary electron current is measured during the measuring time $T_R$ due to the great dependency of the secondary electron signal measurable in the detector on the contact point potential. Shorts and opens can be identified on the basis of the voltage differences which can be documented by detecting the secondary electrons. As indicated in the diagram at the upper right in FIG. 1, the same voltage $V_C$ as at the charging point 100 is measured within the measuring precision when reading the contact point 600 as well. This point is thus conductively connected to the charging point 100, so that an undesired short between the networks A and B is detected. For measuring the potential of the contact points 400 and 700 situated at the underside of the printed circuit board, these are read with a second electron beam having the same energy. Whereas the voltage $V_C$ is observed at the contact point 400, the contact point 700 is uncharged and thus is not short-circuited to the network A. The time-dependency of the voltages measured at these contact points is shown in the diagrams in the lower part of FIG. 1.

An electron beam having a fixed energy is used in the method of the invention for charging and for reading potentials at a network. The result thereof is that every individual contact point also charges during the measuring times $T_R$. A falsification of the measured results as a consequence of the change of potential thereby caused can be avoided since the measuring time $T_R$ is selected adequately short in comparison to the charging time $T_C$. When the electrical properties of an interconnect network comprising N contact points are to be tested and M measurements are to be respectively carried out at each of the contact points, then there is a requirement that the measuring time $T_R$ be shorter than the fraction N×M of the charging time $T_C$. As a result of this limitation of the measuring time, the network is only charged to a voltage less than $V_C$ after M measurements at N contact points, so that a discrimination between charged and uncharged points continues to remain possible.

The capacitance of the network and thus the time $T_C$ for applying the potential $V_C$ rises with an increasing number N of contact points. As a result thereof, the permissable measuring time $T_R$ does not decrease to unrealistically small values given an increasing number of contact points. Dependent on the prescribed threshold for distinguishing between charged and uncharged points, the longest allowable measuring time $T_R$ is again reduced in practice by about the factor 2 in terms of order of magnitude. On the other hand, a minimum measuring time is prescribed by demands made of the signal-to-noise ratio as well as by technological limiting conditions.

A general specification of time ranges is not practical since the charging time $T_C$ and, thus, the read time $T_R$ as well are defined, among other things, by the primary electron current, the primary electron energy, the backscatter coefficient, the desired charge voltage, the number of contact points under investigation, the number of measurements carried out at each contact point, the capacitance of the line network under examination, and other boundary conditions prescribed by the respective measuring format (for example, the signal processing). What is decisive for the implementation of the method of the invention is that the conditions specified above are observed. In accordance therewith, the measuring time $T_R$ given N contact points on the line network and given M measurements must be selected lower than or must be equal to the fraction ($N \times M$) of the charging time $T_C$. For reasons of measuring reliability, the maximum allowable measuring time $T_R$ is thereby reduced again in practice by a factor of 2 to 3. Then, for the maximum allowable scan time per measuring point, the following is true:

$$T_R = T_C/(3NM).$$

This means that a line network having a capacitance of $c = 1pF$ and $N = 10$ contact points at which respectively $M = 2$ measurements are executed with an effective charging current of $I = 10^{-6}$ A (effective charging current = difference between primary electron current and the sum of backscatter and secondary electron current) is charged to a voltage of $U = -10$ V in the time $$T_C = UC/I = 10^{-5} s$$

Based on the equation $$T_R = T_C/(3NM)$$

the maximum possible measuring time is then calculated at $T_R = 166$ ns.

Of course, different charging currents, capacitances and voltages lead to different charging and read times $T_C$ and $T_R$.

Figure 2:
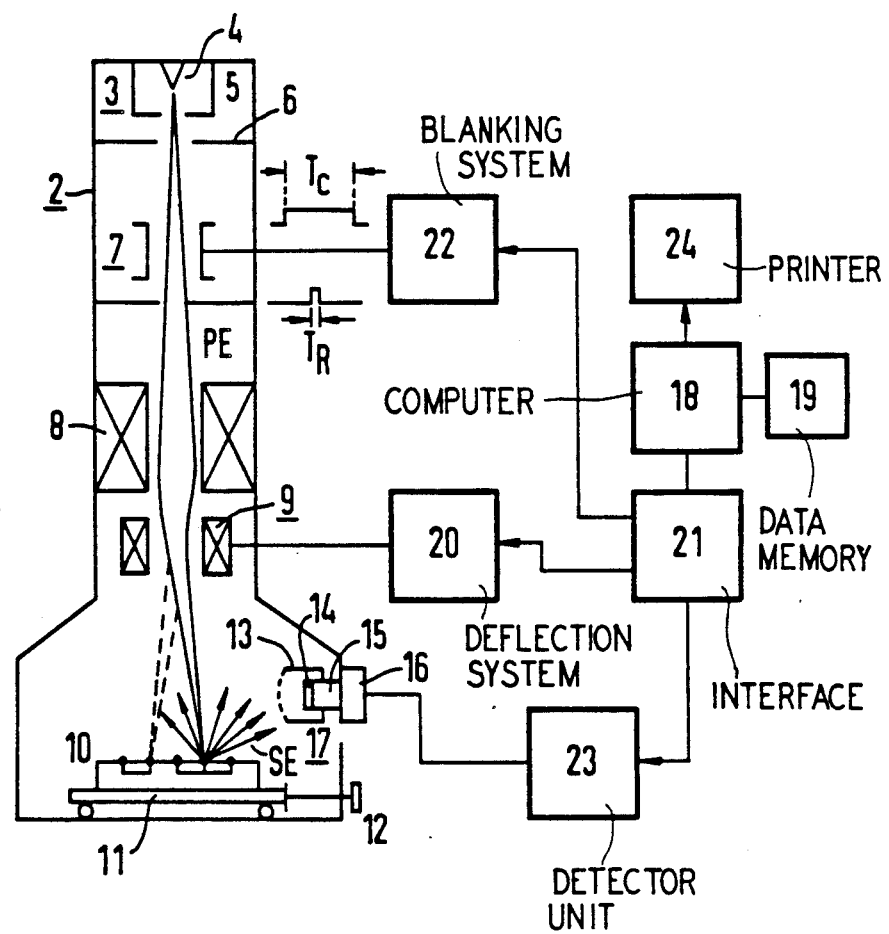
FIG. 2 illustrates an examplary embodiment of an arrangement for the implementation of the method of the invention.

In accordance with the exemplary embodiment of the arrangement for the implementation of the method of the invention as shown in FIG. 2, a finely focused primary electron beam PE is generated in, for example, the electron-optic column 2 of a scanning electron microscope. In addition to a plurality of magnetic coils and diaphragms for beam shaping which are not shown here, this electron-optical column comprises an electron gun 3 essentially composed of cathode 4, Wehnelt electrode 5, and anode 6; a beam blanking system 7; a projection lens 8 for focussing the electron beam onto a specimen 10; and a deflection structure 9. The primary electron beam PE is positioned on a specimen 10, preferably a printed circuit board or a wiring module, and is positioned thereon with the assistance of magnetic fields generated by the deflecting coils. Electrostatic deflection systems can also be utilized alternatively or in addition to magnetic deflection systems. The specimen 10 in the evacuated chamber is mounted on a stage 11 movable in three spatial directions and can thus be aligned relative to the primary electron beam PE. It is aligned, for example, with a mechanical control device 12. A detector system 17 constructed, for example, of shielding grating 13, scintillator 14, light guide 15, and photomultiplier 16 serves for documenting the secondary electrons SE triggered on the specimen 10 by the primary electron beam PE. This detector system is advantageously preceded by an opposing field spectrometer for quantitative measurement of potential in order, by erecting a potential wall, to be able to establish a variable threshold for better discrimination between charged and uncharged points of a network. When, for example, a contact point is charged to a negative voltage $V_C$, then the energy distribution of the secondary electrons emitted from this point shifts toward higher energies by the amount $eV_C$ (e = elementary charge). The result of this is that nearly all of the secondary electrons emitted by charged points into the solid angle of the documentation system reach the detector, whereas a majority of the secondary electrons emitted by the uncharged points which are thus lower in energy are shielded by the opposing field of the spectrometer. The secondary electron currents measured at charged and uncharged contact points therefore differ considerably from one another depending on the height of the opposing field, so that shorts and interruptions can still be reliably documented, even given low charging voltages $V_C$.

It is advantageous to execute the testing method of the invention in computer-controlled fashion for testing the electrical properties of printed circuit boards or of wiring modules which have a large number of contact points. The primary electron beam is positioned with the computer 18 to one of the contact points. The computer reads out the coordinates of the contact point deposited in a data memory 19 and controls the electronics of the deflection system 20 via an intervening interface 21. The electronics of the blanking system 22 is also advantageously controlled by the computer 18 in such fashion that the primary electron beam respectively impinges the interconnect network under test only during the times $T_C$ or $T_R$ during application and read-out of the potential $V_C$, but is otherwise blanked out. This is schematically indicated in FIG. 2 by two rectangular pulses having different widths. As already set forth in detail, the discrimination between charged and uncharged contact points occurs by means of comparing the secondary electron signals observed at the individual points. This comparison can likewise be carried out with the computer 18 since this computer 18 stores the secondary electron signals supplied by the detector electronics 23 at the N contact points of the interconnect network and compares them to a rated value, for example the secondary electron signal at the charging point or the signals at the N contact points before charging of the network. It makes this comparison either immediately or only after all contact points have been read. Corrections of the secondary electron signals which may become necessary are likewise carried out by the computer. The shorts and open thus identified in the interconnect network can be subsequently output, for example, on a printer 24 in the form of a test protocol.

As set forth in detail in the specification, the documentation of shorts and interruptions in an interconnect network occurs by comparing the secondary electron signals measured at various contact points of the network to a reference value. The type of particle or radiation which the secondary electrons trigger at a specimen is not of decisive significance for the method of the invention, since the secondary electron signal to be measured in a detector system essentially depends only on the specimen potential and on local electrical fields. Any type of particle beam or electro-magnetic radiation wherein secondary electrons are triggered at a specimen can therefore be utilized for the implementation of the method.

Although various minor changes and modifications might be proposed by those skilled in the art, it will be understood that we wish to include within the claims of the patent warranted hereon all such changes and modifications as reasonably come within our contribution to the art.

We claim as our invention:

1. A particle beam measuring method for non-contact testing of an interconnect network for shorts and opens, comprising the steps of:

measuring reference signals at uncharged contact points before charging at least one point of the interconnect network, and intermediately storing the reference signals;

charging said at least one point of the interconnect network during a first time span by use of a particle beam of given energy directed to the at least one point;

subsequently directing the same particle beam with the same given energy to at least one further point of the same interconnect network; and determining a potential at said at least one further point during a second time span by a measurement of secondary electrons emitted from said at least one further point, said second time span being significantly shorter in comparison to said first time span and the energy of said particle beam having the same value during both the first and second time spans.

2. A particle beam measuring method for non-contact testing of an interconnect network for shorts and interruptions, comprising the steps of:

charging at least one point of the interconnect network to a specific voltage potential during a first time duration of predetermined length by directing a particle beam of given energy to the at least one point;

measuring a voltage potential of at least one further point of the same interconnect network by directing a particle beam having an energy which is the same as an energy of the particle beam charging the at least one point for a second time duration whose length is substantially shorter in comparison to the first time duration length;

comparing the voltage potential at an end of the second time duration at said at least one further point with a reference potential; and said reference potential being a voltage potential at said at least one further point determined in a calibration sequence before charging said at least one point.

3. A particle beam measuring method for non-contact testing of an interconnect network for shorts and interruptions, comprising the steps of:

charging at least one point of the interconnect network to a specific voltage potential during a first time duration of predetermined length by directing a particle beam of given energy to the at least one point;

measuring a voltage potential of at least one further point of the same interconnect network by directing a particle beam having an energy which is the same as an energy of the particle beam charging the at least one point for a second time duration whose length is substantially shorter in comparison to the first time duration length;

comparing the voltage potential at an end of the second time duration at said at least one further point with a reference potential; and said reference potential comprising a voltage potential at a reference point in the interconnect network determined in a calibration sequence before charging said at least one point of the interconnect network.

4. A particle beam measuring method according to claim 3 including the step of monitoring the charging of said interconnect network at said at least one point to a desired voltage by detecting secondary electrons emitted therefrom.

5. A particle beam measuring method according to claim 3 including the step of quantitatively measuring voltage potentials at the charging point and further point by employing an opposing field spectrometer.

6. A particle beam measuring method according to claim 3 including the step of generating and measuring potentials at the charging point and the further point of the interconnect network with an electron beam.

7. A particle beam measuring method according to claim 3 wherein said particle beam is generated in a scanning electron microscope.

8. A particle beam measuring method according to claim 3 including the step of positioning said particle beam to a plurality of contact points of the interconnect network by a computer controlling a deflection system for the particle beam.

9. A particle beam measuring method according to claim 3 including the step of gating and blanking said particle beam by a computer controlling a beam blanking system for the particle beam.

10. A particle beam measuring method according to claim 3 including the step of depositing coordinates of a plurality of interrogated points of the network in a data memory.

11. A particle beam measuring method according to claim 3 including the step of intermediately storing secondary electron signals measured at interrogated points of the interconnect network.

12. A particle beam measuring method according to claim 3 including outputting a test protocol on a printer.

13. A particle beam measuring method according to claim 3 wherein said interconnect network is part of an LSI circuit.

14. A particle beam measuring method according to claim 3 wherein said interconnect network comprises a printed circuit board.

15. A particle beam measuring method according to claim 3 wherein said interconnect network comprises a wiring module.

16. A particle beam measuring method according to claim 3 wherein a plurality of further points are interrogated after charging the at least one point.

* * * * *